US006021080A

United States Patent [19]

Miyano

[11] Patent Number: 6,021,080

[45] Date of Patent: Feb. 1, 2000

[54] SEMICONDUCTOR MEMORY DEVICE HAVING A VOLTAGE CONVERTING CIRCUIT

[75] Inventor: Kazutaka Miyano, Tokyo, Japan

[73] Assignee: NEC Corporation, Tokyo, Japan

[21] Appl. No.: 08/821,927

[22] Filed: Mar. 21, 1997

[30] Foreign Application Priority Data

Mar. 22, 1996 [JP] Japan .................................... 8-065904

[51] Int. Cl.[7] ........................................................ G11C 7/00

[52] U.S. Cl. ...................... 365/226; 365/229; 365/189.09

[58] Field of Search .................................... 365/226, 227, 365/63, 51, 229, 189.09, 189.11; 323/273

[56] References Cited

U.S. PATENT DOCUMENTS 5,463,588 10/1995 Chonan .................................. 365/226
5,598,363 1/1997 Uchida .................................... 365/226
5,619,472 4/1997 Okamura ................................ 365/226
5,631,547 5/1997 Fujioka et al. .......................... 323/273

FOREIGN PATENT DOCUMENTS 1241091 9/1989 Japan .
253289 2/1990 Japan .

*Primary Examiner*—David Nelms
*Assistant Examiner*—David Lam
*Attorney, Agent, or Firm*—Sughrue, Mion, Zinn, Macpeak & Seas, PLLC

[57] ABSTRACT

The voltage reducing circuit 40 comprises driver circuits 21 to 24 corresponding to the memory cell arrays 11 to 14, and only one control circuit 20. Each of the driver circuit changes an external power source voltage VEXT into the internal power source voltage INTS and supplies the internal power source voltage INTS to one corresponding memory cell array according to a control signal C1. The control circuit commonly receives the internal power source voltage INTS and generates the control signal in response to the level of the internal power source voltage. The control signal is commonly provided to the driver circuits.

13 Claims, 6 Drawing Sheets

SEMICONDUCTOR MEMORY DEVICE HAVING A VOLTAGE CONVERTING CIRCUIT

BACKGROUND OF THE INVENTION

The present invention relates to a semiconductor memory device, and, more specifically, to a semiconductor memory device having a voltage converting circuit which receives an external power voltage and produces a internal power voltage different from the external power voltage.

As capacity of the semiconductor memory device is increased, each element formed therein is required to operate on a lower voltage. Accordingly, it is necessary to reduce a power source voltage to be supplied to each element in order to prevent the elements such as a MOS transistor from being destroyed. For example, in 64M-bits DRAM, it is required that the internal elements such as MOS transistors operates on 2.0 V.

For this purpose, such a technique is widely employed that the external power source voltage is reduced or lowered to produce an internal power source voltage having a level suitable for fine elements. Such a technique has materialized by a voltage reducing circuit. On the other hand, the semiconductor memory device has a plurality of memory cell arrays and the internal power source voltage is provided to every the memory cell array.

An apparatus satisfying the above conditions is suggested as follow. The apparatus has one voltage reducing circuit and a plurality of memory cell arrays commonly connected to the voltage reducing circuit. However, the wiring layer connected between the voltage reducing circuit and memory cell arrays must be long since the distance between the voltage reducing circuit and memory cell arrays becomes long. On the other hand, the wiring layer naturally have a sufficient width to provide a sufficient current to the plurality of memory cell arrays. That is why it is necessary to provide a large current to consume a lot of current in each memory cell array and to equally provide the current to the memory cell arrays. Accordingly, it is problem that a size of a semiconductor chip increases due to a large area of the wiring layer.

To solve the problem, Another apparatus is suggested. The apparatus has a plurality of voltage reducing circuit and a plurality of memory cell arrays each connected to the respective voltage reducing circuits. The length of the wiring layer can be short since the voltage reducing circuit is able to be arranged nearly with the respective memory cell arrays. The problem is therefore solve. However, New problem is occurred that the size of the semiconductor chip increases and the consumed current increases since a plurality of the voltage reducing circuits are needed.

SUMMARY OF THE INVENTION

Therefore, it is an object of the present invention to provide a voltage converting circuit which can reduce the size of the semiconductor chip and have efficient current ability at an output thereof.

It is other object of the present invention to provide a semiconductor memory device being compact and providing efficient current to a plurality of memory cell arrays.

A semiconductor memory device of the present invention comprises a plurality of memory cell arrays, a voltage line, a plurality of driving transistors each coupled between the voltage line and an associated one of the memory cell arrays and having a control gate supplied a control signal, and a control circuit responding to a voltage derived from at least one of the driving transistors and producing the control signal.

A voltage converting circuit of the present invention comprises, a first power source line supplied with a first power voltage, a plurality of first wiring layers, a plurality of driving circuits each connected between the first power source wiring layer and a corresponding one of the first wiring layers, converting the first power voltage to a second power voltage in response to a control signal, and supplying the second voltage to a corresponding one of the first wiring layers, a second wiring layer provided to connect the first wiring layers in common, and a control circuit responding to a voltage of the second wiring layer and producing the control signal.

As the mentioned above herein, the inventer have thought of an idea that the voltage converting circuit has the driving circuit and the control circuit and the driving circuit and the control circuit can be arranged separately each other. Each of the driving circuits therefore is arranged nearly to the respective memory cell arrays and the control circuit is arranged apart from the driving circuits. The width of the wiring layer connected between the control circuit and the driving circuit can be narrow since they do not need to flow the sufficient current to the memory cell array.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
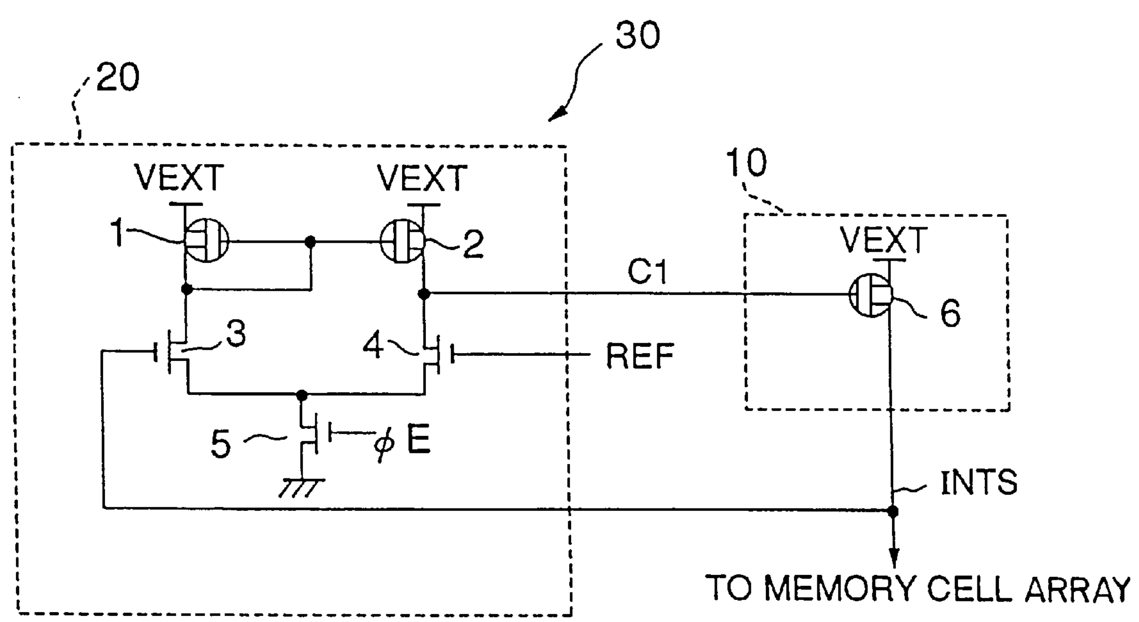
FIG. 1 shows a voltage reducing circuit of the related art.

Before embodiments of the present invention are described, the related arts will be described in detail referring to the drawing.

Referring to FIG. 1, a voltage reducing circuit 30 is shown. The voltage reducing circuit 30 reduces or lowers an external power source voltage VEXT provided with an external power source line (for example, 3.3 V) to an internal power source voltage INTS which does not exceed a reference voltage REF (for example, 2.0 V) lower than this external power source voltage VEXT. The voltage reducing circuit 30 provides this internal power source voltage INTS to one respective memory cell arrays.

The voltage reducing circuit 30 has a driver circuit 10. The driver circuit 10 has a P-channel type MOSFET (metal oxide semiconductor field effect transistor) 6 which controls the supply from the external power source voltage VEXT to the memory cell array according to a control signal C1. The MOSFET 6 generates the internal power source voltage INTS, and the internal power source voltage INTS drives the memory cell array.

Furthermore, the voltage reducing circuit 30 has a control circuit 20. The control circuit 20 has a mirror amplifier in which the internal power source voltage INTS is compared to the reference voltage REF, and the control signal C1 is generated in such a manner that the internal power source voltage INTS does not exceed the reference voltage REF. The control signal C1 is provided from the control circuit 20 to the driver circuit 10. The mirror amplifier has P-channel type MOSFETs 1, 2 and N-channel type MOSFETs 3, 4, 5.

In the mirror amplifier, the external power source voltage VEXT is provided to the P-channel type MOSFETs 1 and 2. The internal power source voltage INTS and the reference voltage REF are provided to gates of the N-channel type MOSFETs 3 and 4 respectively to compare the internal power source voltage INTS with the reference voltage REF. The comparison result carried out by the mirror amplifier is provided to the gate of the p-channel type MOSFET 6 of the driver circuit 10 as the control signal C1. An enable signal ϕE is provided to the gate of the n-channel type MOSFET 5 and is produced by the memory cell array enable signal (not shown) for the memory cell array. A source of the n-channel type MOSFET 5 is grounded.

When the enable signal ϕE becomes a high level, the mirror amplifier compares the internal power source voltage INTS with the reference voltage REF. If the internal power source voltage INTS is at higher level than the reference voltage REF, the control signal C1 is analog-transited to a low level.

Figure 2:
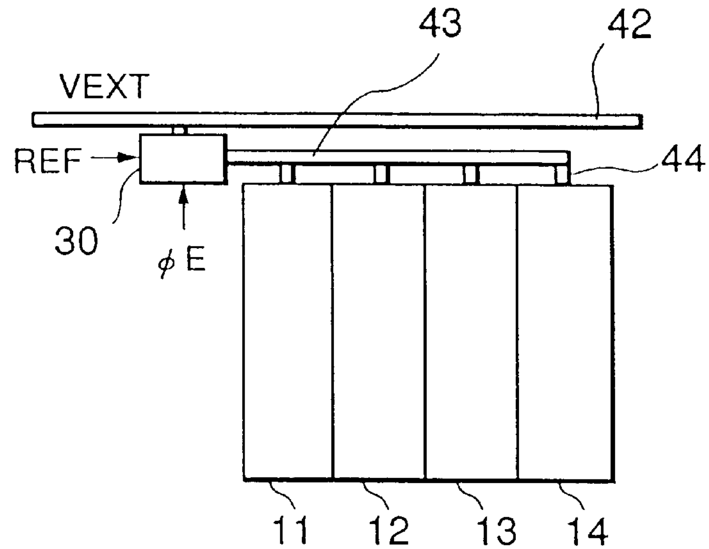
FIG. 2 shows a semiconductor memory device of the related art.
Figure 3:
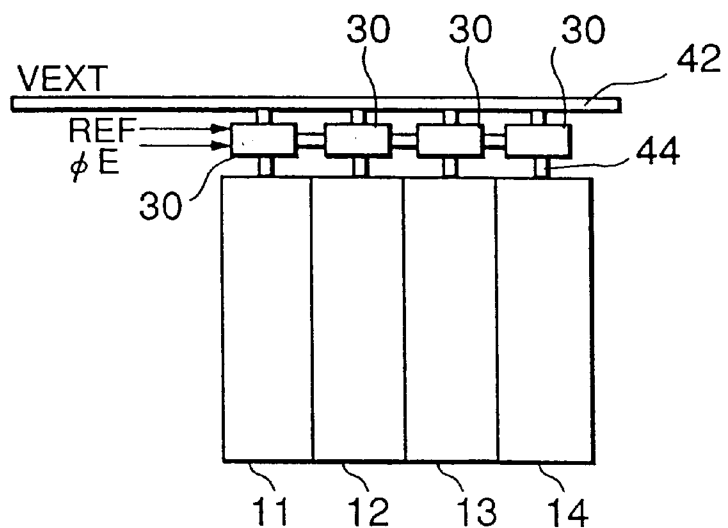
FIG. 3 shows another semiconductor memory device of the related art.

Two related art semiconductor device are shown in FIGS. 2 and 3.

The semiconductor memory device shown in FIG. 2 has one voltage reducing circuit 30 shown in FIG. 1 and a plurality of memory cell arrays 11 to 14 connected to commonly the voltage reducing circuit 30. The internal power source voltage INTS (shown in FIG. 1) is provided to a plurality of memory cell arrays 11 to 14 via one horizontal internal power source voltage supply wiring layer 43 having a relatively large width and a plurality of vertical internal power source voltage supply wiring layer 44 having the relatively large width. The external power source voltage VEXT (shown in FIG. 1) is provided to the voltage reducing circuit 30 from an external power source wiring layer 42.

However, the semiconductor memory device shown in FIG. 2 needs the horizontal internal power source voltage supply wiring layer 43 whose width is relatively large so as to connect the voltage reducing circuit 30 to a plurality of vertical internal power source voltage supply wiring layer 44. Due to the horizontal internal power source voltage supply wiring layer 43, there is such a fault that a size of a semiconductor chip increases. When the horizontal internal power source voltage supply wiring layer 43 is smaller or narrower, there is such a fear that the difference among the voltages supplied to a plurality of memory cell arrays 11 to 14 occurs.

The semiconductor memory device shown in FIG. 3 has a plurality of voltage reducing circuits 30 shown in FIG. 1 and a plurality of memory cell arrays 11 to 14 each connected to the respective voltage reducing circuits 30. A plurality of internal power source voltages INTS (shown in FIG. 1) are provided to a plurality of memory cell arrays 11 to 14 via a plurality of vertical internal power source voltage supply wiring layers 44 having the relatively large width. The external power source voltage VEXT (shown in FIG. 1) is provided to a plurality of voltage reducing circuits 30 from the external power source wiring layer 42.

However, the semiconductor memory device shown in FIG. 3 needs a plurality of voltage reducing circuit 30 corresponding one of a plurality of memory cell arrays 11 to 14. The size of the semiconductor chip therefore increases. Furthermore, since the current is steadily flowed to the mirror amplifier of the control circuit of each voltage reducing circuit 30 during operation, there is such a fault that the consumed current is also increased, as the number of the voltage reducing circuit 30 is increases.

Turning to the FIG. 4 to FIG. 7, embodiments of the present invention will be described in detail.

Figure 4:
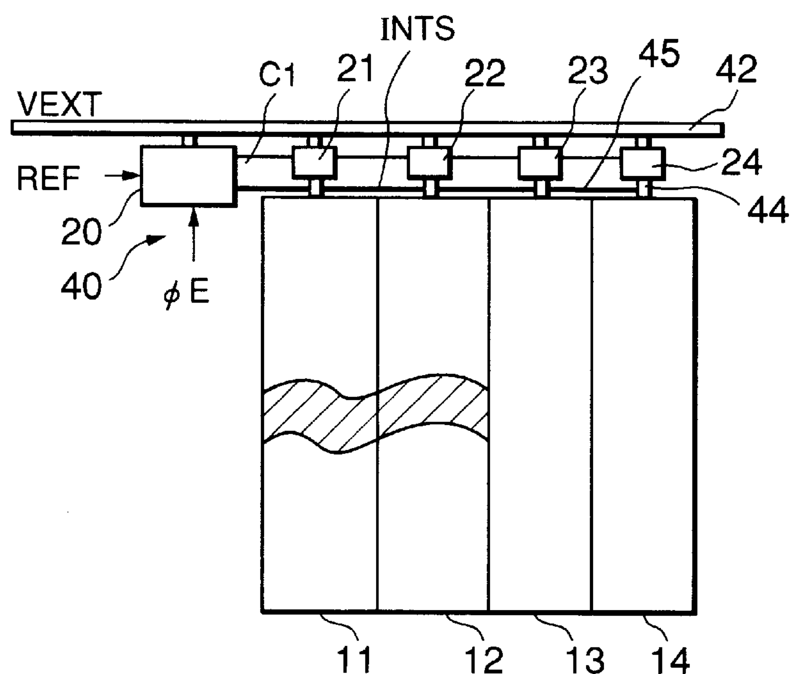
FIG. 4 shows a semiconductor memory device according to a first embodiment of the present invention.

Referring to FIG. 4, a semiconductor memory device according to a first embodiment of the present invention includes the same elements having the same reference numbers shown in FIGS. 1, 2 and 3. The semiconductor memory device comprises a plurality of memory cell arrays 11 to 14 and a voltage reducing circuit 40 which is supplied with an external power source voltage VEXT from an external power source wiring layer 42.

Each driver circuit 21 to 24 is arranged corresponding one of the memory cell arrays 11 to 14 and one control circuit 20 is arranged to control driver circuits 21 to 24. The internal power source voltage INTS is commonly supplied to a plurality of memory cell arrays 11 to 14 via a plurality of internal power source voltage supply wiring layers 44. An inner circuit in the control circuit 20 and the driver circuits 21 to 24 is not specifically limited to the present invention.

Figure 5:
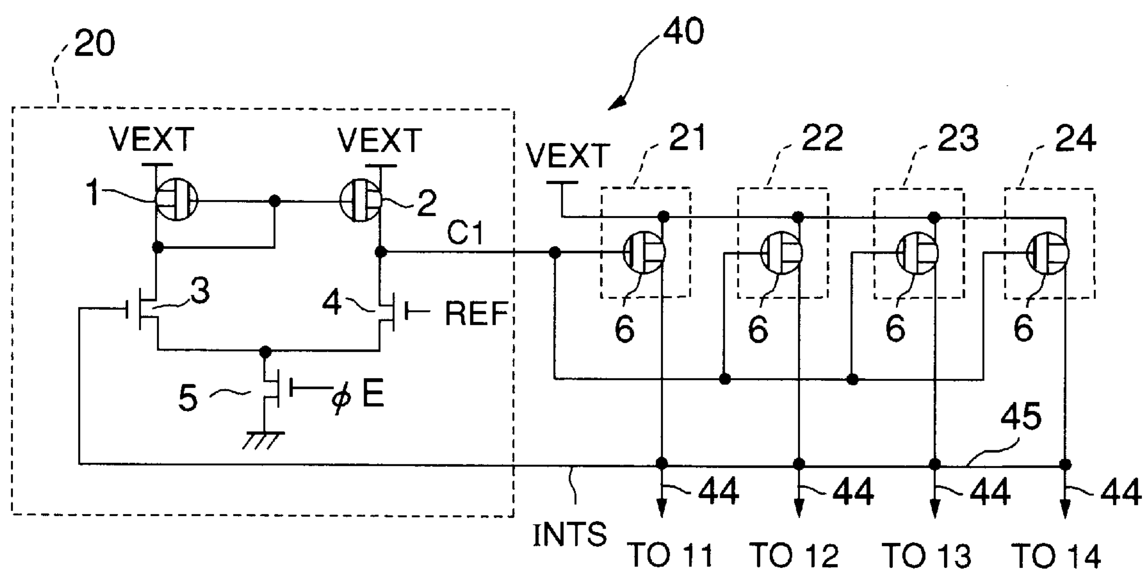
FIG. 5 shows a voltage reducing circuit of the semiconductor memory device shown in FIG. 4.

Referring to FIG. 5, the voltage reducing circuit 40 comprises a plurality of driver circuits 21 to 24 each arranged corresponding to one of a plurality of memory cell arrays 11 to 14, a plurality of internal power source voltage supply wiring layers 44 each arranged corresponding to one of a plurality of driver circuits 21 to 24, for correspondingly connecting a plurality of driver circuits 21 to 24 to a plurality of memory cell arrays 11 to 14, a common connecting wiring layer 45 for commonly connecting a plurality of internal power source voltage supply wiring layers 44, and only one control circuit 20. Each of a plurality of internal power source voltage supply wiring layers 44 is a vertical internal power source voltage supply wiring layer having a relatively large first width. The common connecting wiring layer 45 has a second width thinner or narrower than the first width. Each of a plurality of driver circuits 21 to 24 is constructed similarly to the driver circuit shown in FIG. 1. Each of a plurality of driver circuits 21 to 24 controls the supply from the external power source voltage to the corresponding to the internal power source voltage supply wiring layers 44 according to a control signal C1 at the same time. Thereby, the internal power source voltage INTS is generated on each internal power source voltage supply wiring layer 44. The control circuit 20 is constructed similarly to the control circuit 20 shown in FIG. 1. The control circuit 20 is commonly connected to the common connecting wiring layer 45. The control signal C1 is provided to a plurality of driver circuits 21 to 24.

Each of a plurality of driver circuits 21 to 24 being same as the driver circuit 10 shown in FIG. 1 is separated from one another. A plurality of driver circuits 21 to 24 are arranged at different positions from one another. The external power source voltage VEXT is connected to each of a plurality of driver circuits 21 to 24. The control signal Cl is commonly supplied to each of a plurality of driver circuits 21 to 24 from the control circuit 20.

In FIGS. 4 and 5, when the internal power source voltage INTS is fallen, the level of the internal power source voltage INTS transfers the common connecting wiring layer 45. The control signal C1 changes low-level analogously in response to the level at the common connecting wiring layer 45. Each p-channel type MOSFET 6 make the level of the internal power source voltage INTS higher in response to the control signal C1. When the internal power source voltage INTS is higher, the MOSFETs 6 drive the internal power source voltage INTS inversely. Accordingly, the internal power source voltage INTS is almost constant. Here, the common connecting wiring layer 45 is used for adjusting a slight difference between the internal power source voltages of a plurality of memory cell arrays 11 to 14. Accordingly, the common connecting wiring layer 45 may be thinner or narrower than the internal power source voltage supply wiring layer 44, and it can only have such a width as the width of a usual signal wiring layer.

Compared the semiconductor memory device shown in FIG. 2 to the semiconductor memory device shown in FIG. 4, in case of the present invention, a horizontal internal power source voltage supply wiring layer 43 having a relatively large width necessary shown in FIG. 2 is unnecessary. The horizontal internal power source voltage supply wiring layer 43 is replaced by the wiring layer having about 1 μm to 2 μm shown by the common connecting wiring layer 45 in FIG. 4. For example, assume such a construction that the internal power source voltage supply wiring layer 43 shown in FIG. 2 is wiring layerd on a semiconductor chip whose area is 20 mm×10 mm in a longitudinal direction of the semiconductor chip. If the internal power source voltage supply wiring layer 43 needs 100 μm, the common connecting wiring layer 45 in FIG. 4 needs only 1 μm to 2 μm. Accordingly, since the width of the common connecting wiring layer 45 can be ignored, the area necessary for the semiconductor chip is 20 mm×9.8 mm. That is, about 2% area is reduced.

Furthermore, compared the semiconductor memory device shown in FIG. 4 to the semiconductor memory device shown in FIG. 3, although the semiconductor memory device shown in FIG. 4 has only one control circuit, the semiconductor memory device shown in FIG. 3 needs four control circuits since the control circuit is necessary for each driver circuit. That is, the semiconductor memory device shown in FIG. 4 consumes only quarter current, compared to the semiconductor memory device shown in FIG. 3. For example, assume that an average current of 5 mA is flowed per control circuit. The semiconductor memory device shown in FIG. 3 consumes four (control circuits)×5 mA=20 mA. While, the semiconductor memory device shown in FIG. 4 consumes one (control circuit)×5 mA=5 mA.

Figure 6:
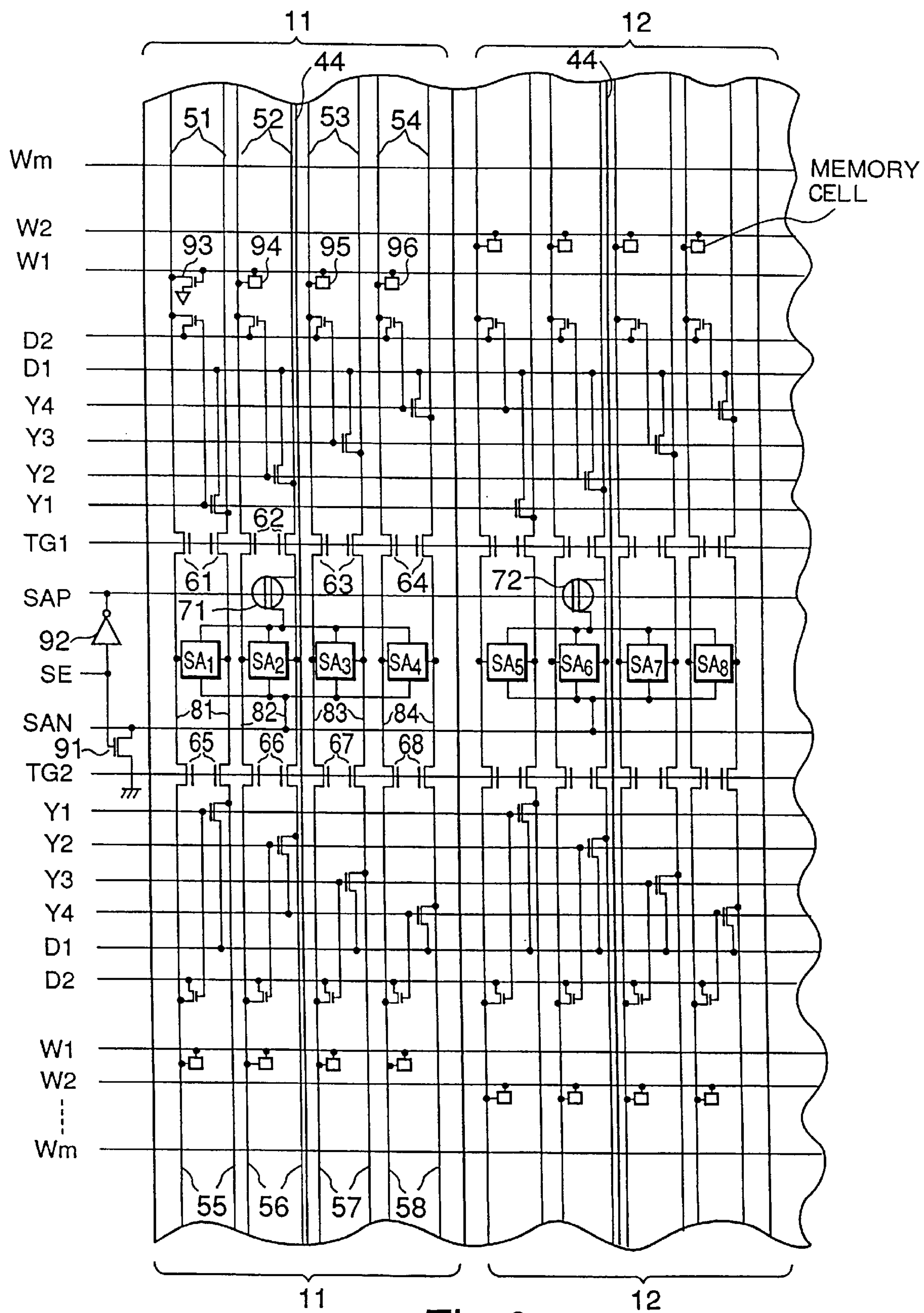
FIG. 6 shows circuit structure a part of the each memory cell arrays 11 to 14 in FIG. 4.

Refereeing to FIG. 6, circuit structure of a part of the memory cell arrays 11 and 12 are shown (the shaded portion in FIG. 4). A portion of the memory cell array 11 and a portion of the memory cell array 12 is almost same layout except for the location of memory cells. Only the circuit structure of the memory cell array 11 therefore explains in detail.

Figure 7:
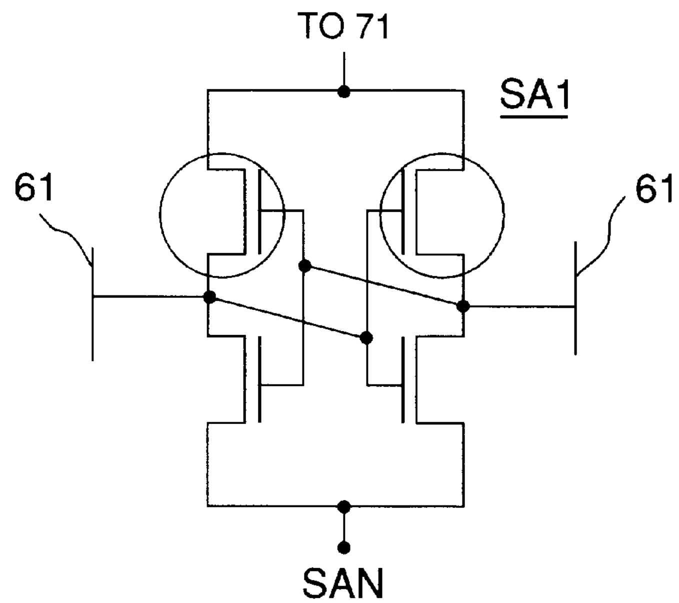
FIG. 7 shows a sense amplifier shown in FIG. 6.

The memory cell array 11 comprises 4 sense amplifiers SA1–SA4. The sense amplifier SA1–SA4 are connected to bit line pairs 81–84 respectively. The both side of the bit line pair 81 is provided nMOSFET pair 61 whose gates are connected to a signal TG1 and nMOSFET pair 65 whose gates are connected to a signal TG2. The signal TG1 is complement to the signal TG2. The other side of the nMOS transistor pair 61 is connected to a bit line pair 51 and the other side of the nMOS transistor pair 65 is connected to a bit line pair 55. Accordingly, for example, when the signal TG1 is in high level and the signal TG2 is in low level, the bit line pairs 51–54 are connected to the bit line pairs 81–84 respectively. Each of bit line pairs 82–84 is as same structure as the bit line pair 81. The bit line pairs 51–54 crosses with 4 bit line select signal lines Y1–Y4 , data lines D1–D2 and a plurality of word line W1-Wm (m:integer). The electronic connection between the data lines D1–D2 and the bit line pair 51 is controlled by the bit select signal Y1, the electronic connection between the data lines D1–D2 and the bit line pair 52 is controlled by the signal bit select signal Y2, the electronic connection between the data lines D1–D2 and the bit line pair 53 is controlled by the bit select signal Y3, and the electronic connection between the data lines D1–D2 and the bit line pair 54 is controlled by the signal bit select signal Y4. Memory cells are arranged at each of cross points between the word line W1 and the bit line pairs 51–54. The bit line pairs 55–58 are arranged as same structure as the bit line pairs 51–54. A sense amplifier driving signal line SAP and SAN are arranged at one side and the other side of the sense amplifiers SA1–SA4 respectively. Moreover, the internal power source voltage supply wiring layer 44 are arranged vertically in the central portion of the memory cell array 11. The p-channel type MOSFET 71 of which a gate is connected to the sense amplifier driving signal line SAP is connected between the internal power source voltage supply wiring layer 44 and the sense amplifiers SA1–SA4 as shown in FIG. 7. The sense amplifiers SA1–SA4 are connected to the sense amplifier driving signal line SAN in common. A n-channel type MOSFET 91 is connected between a ground source and the internal amplifier driving signal line SAN. The gate of MOSFET 91 is connected to a sense enable signal SE. The sense enable signal line SE is connected to the signal line SAP via an inverter 92. When the sense amplifier enable signal SE is in low level, the MOSFETS 71 and 91 do not activate. When the sense amplifier enable signal SE is in high level, the MOSFETs 71 and 91 activate. The sense amplifier SA1–SA4 are provided with the internal ground source voltage from the ground source and the internal power source from the internal power source voltage supply wiring layer 44. A bit line balancing circuit and a bit line precharging circuit (not shown) are provided in the memory cell array in fact.

The read out operation of the semiconductor memory device of the embodiment will be described simply. For example, the read out operation of the memory cell 93–96 will be described.

At first, the bit line pairs 51–58, 81–84 are precharged at a redetermined voltage, for example, ½ Vcc. The word lines W1-Wm, the bit select signal Y1–Y4, the enable signal φE, the sense enable signal SE and are in low level.

Next, the signal TG1 changes in a high level and the signal TG2 changes in a low level. The bit line pairs 51–54 and 81–84 therefore are connected each other respectively. The word line W1 changes in a high level. The data stored in the memory cell 93–96 are transferred to the bit line pairs 51–54 respectively to thereby produce small voltage difference between one and the other bit lines of each of bit line pairs 51–54. The enable signal φE changes in a high level to activate the control circuit 20. The internal power source voltage INTS is supplied from the control circuit 20 to the internal power source voltage supply wiring layer 44. The sense enable signal SE changes in a high level to activate the sense amplifiers SA1–SA4. The small voltage deferent between one bit line and the other bit line of each of the bit line pairs 51–54 is amplifiered so that one bit line of bit line pair changes in a ground source voltage and the other bit line changes in a internal power source voltage. The bit select signal Y1–Y4 changes in a high level sequentially to read out the data holding the bit line pairs 51–54 respectively.

Figure 8:
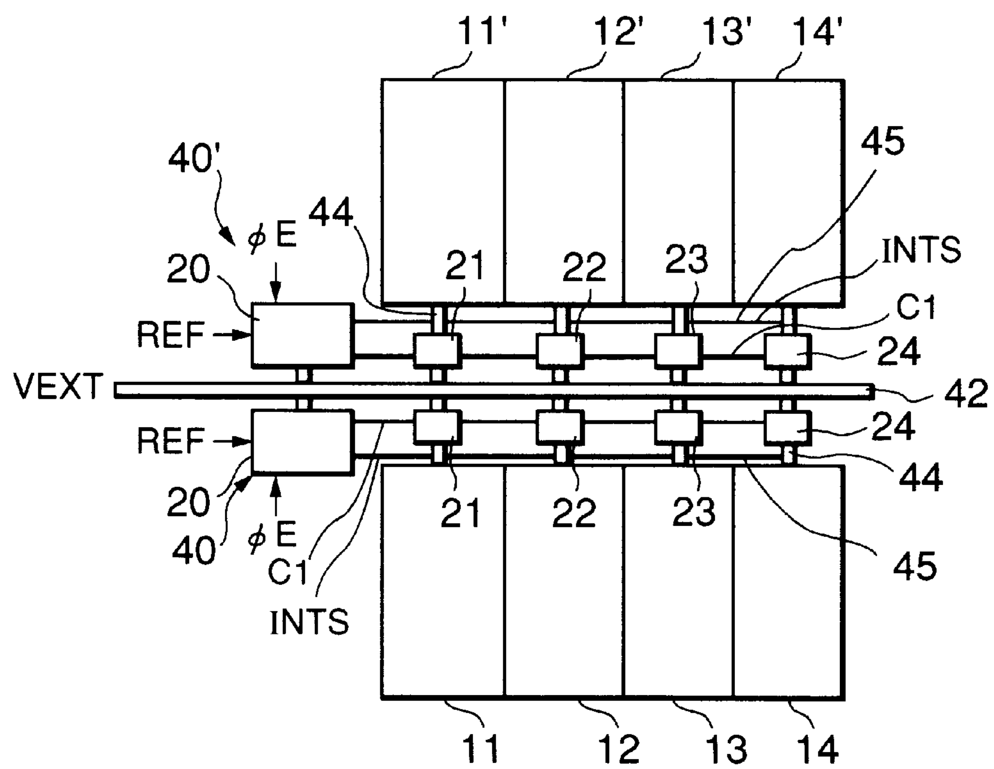
FIG. 8 shows a semiconductor memory device according to a second embodiment of the present invention.

Referring to FIG. 8, the semiconductor memory device according to a second embodiment comprises a plurality of memory arrays 11 to 14, a voltage reducing circuit 40, a plurality of memory arrays 11' to 14' and a voltage reducing circuit 40' arranged symmetrically about the external power source wiring layer 42 relative to a plurality of memory arrays 11 to 14 and the voltage reducing circuit 40. The voltage reducing circuit 40' is constructed similarly to the voltage reducing circuit 40. A plurality of memory arrays 11 to 14 are independent of a plurality of memory arrays 11' to 14'. The voltage reducing circuits 40, 40' can be synchronously operated by the enable signal ϕE provided to the control circuit 20 of the voltage reducing circuits 40, 40'. In this case, the external power source wiring layer 42 may have only one system for the memory arrays 11 to 14 and the memory arrays 11' to 14'. Each of the memory arrays 11 to 14 and the memory arrays 11' to 14' does not need to have respective independent external power source wiring layer.

According to the present invention explained above, it is possible to obtain a semiconductor memory device having a plurality of cell arrays and a voltage reducing circuit and being compact, in which consumption current is reduced.

It is apparent that the present invention is not limited to the above embodiments but may be modified and changed without from the scope and the spirit of the invention.

Figure 9:
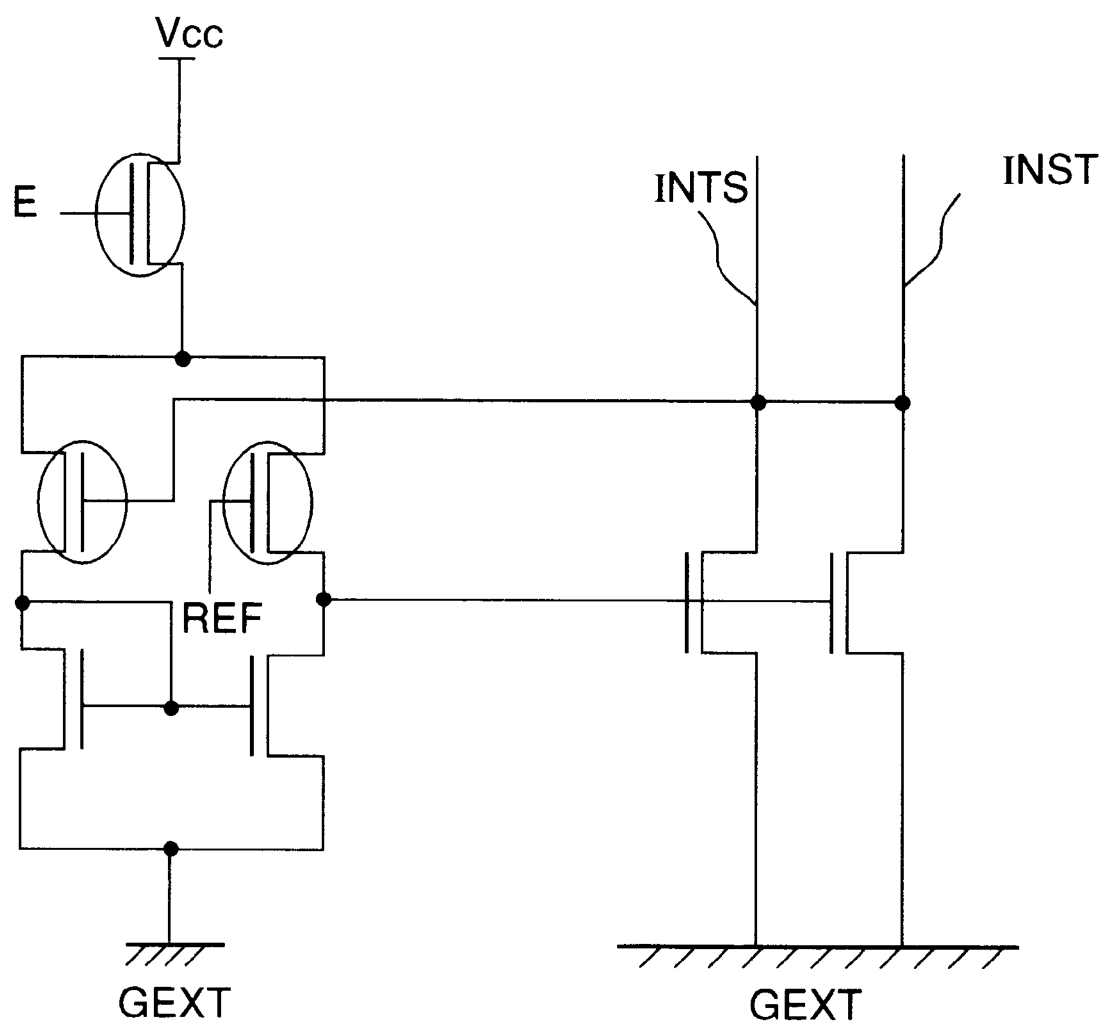
FIG. 9 shows a voltage converting circuit of the present invention.

For example, the number of the driving circuits 21–24 is not limited to the embodiments and at least two and more. It is natural that the number of the memory cell array is not limited to the embodiments. The present invention is not limited to the voltage reducing circuit. For example, a voltage increasing or step-up circuit is possible shown in FIG. 9. The voltage increasing circuit increases the external power source voltage GEXT to a increased voltage INTS and the increased voltage commonly provides to a plurality of output nodes thereof. In a word, the present invention relates to the voltage converting circuit which converts an external power source voltage to a internal power source voltage different from the external power source voltage. The number of the memory cell arrays, the number of the bit line pairs in one memory cell array is not limited to the embodiment. In fact, the 16 memory cell arrays and 256 bit line pairs are arranged respectively.

What is claimed is:

1. A semiconductor memory device comprising:

a power source line extending in a first direction;

a wiring layer extending substantially in parallel to said power source line;

a first transistor coupled between said power source line and said wiring layer and disposed in a second direction perpendicular to said first direction;

a second transistor coupled between said power source line and said wiring layer and provided apart from said first transistor and disposed in said second direction;

a first memory cell array arranged substantially in line with said first transistor and coupled to said wiring layer to receive an operating voltage from said wiring layer; and a second memory cell array arranged substantially in line with said second transistor and coupled to said wiring layer to receive an operating voltage from said wiring layer.

2. The device as claimed in claim 1, wherein each of said first and second memory cell arrays includes a set of sense amplifiers, the set of sense amplifiers of said first memory cell array receiving the operating voltage from a first point of said wiring layer, and the set of sense amplifiers of said second memory cell array receiving the operating voltage from a second point of said wiring layer, said second point being apart from said first point.

3. The device as claimed in claim 1, further comprising:

a circuit disposed apart from first and second transistors to generate a gate control voltage in response to the operating voltage on said wiring layer; and a control line coupled to said circuit to convey said gate control voltage in common to gates of said first and second transistors.

4. A semiconductor memory device comprising:

a power source line extending in a first direction and having a first point and a second point apart from said first point;

a first memory cell array disposed on one side with respect with said power source line adjacently to said second point and having a first node;

a second memory cell array disposed on other side with respect to said power source line adjacently to said second point and having a second node;

a first transistor connected between said second point and said first node, providing a first operating voltage at said first node; and a second transistor connected between said second point and said second node, providing a second operating voltage at said second node.

5. The device as claimed in claim 4, wherein said power source line further has a third point apart from said first and second points, and said device further comprising:

a third memory cell array disposed on said one side and having a third node;

a third transistor disposed on said one side to be connected between said third point and said third node, said first gate control voltage being supplied further to a gate of said third transistor by said first control line;

a fourth memory cell array disposed on said other side and having a fourth node; and a fourth transistor disposed on said one side to be connected between said third point and said fourth node, said second gate control voltage being supplied further to a gate of said fourth transistor by said second control line.

6. The device as claimed in claim 5, wherein said first and third nodes are connected to each other by a first node line and said second and fourth nodes are connected to each other by a second node line.

7. The device as claimed in claim 6, wherein each of said first, second, third and fourth memory cell arrays includes a set of sense amplifiers, the sets of sense amplifiers of said first and third memory cell arrays receiving said first operating voltage respectively from said first and third nodes, and the sets of sense amplifiers of said second and fourth memory cell arrays receiving said second operating voltage respectively from said second and fourth nodes.

8. The device as claimed in claim 7, wherein said second point, said first and third nodes, said first and second transistors, and said sets of sense amplifiers of said first and second memory cell arrays are arranged in a first line in a second direction perpendicular to said first direction, said third point, said third and fourth nodes, said third and fourth transistors, and said sets of sense amplifiers of said third and fourth memory cell arrays are arranged in a second line parallel with said first line in said second direction.

9. The device as claimed in claim 4, further comprising:

a first differential amplifier disposed on said one side adjacently to said first point and remotely from said second point and connected to said first point to generate said first gate control voltage in response to said first operating voltage at said first node;

a first control line coupled to said first differential amplifier to convey said first gate control voltage to gate of said first transistor;

a second differential amplifier disposed on said other side adjacently to said first point and remotely from said second point and connected to said first point to generate said second gate control voltage in response to said second operating voltage at said second node; and a second control line coupled to said second differential amplifier to convey said second gate control voltage to gate of said second transistor.

10. A semiconductor memory device comprising:

a power source line extending in a first direction and having first, second, and third points which are apart from one another;

a first memory cell array disposed adjacently to said second point;

a second memory cell array disposed adjacently to said third point;

a first transistor connected between said second point and said first memory cell array to supply a first operating voltage to said first memory cell array; and a second transistor connected between said third point and said second memory cell array to supply a second operating voltage to said second memory cell array; and a differential amplifier disposed adjacently to said first point and remotely from said second and third points and connected to said first point, said differential amplifier generating a gate control voltage in response to at least one of said first and said second operating voltage, said gate control voltage being supplied in common to gates of said first and second transistors.

11. The device as claimed in claim 10, wherein said first transistor is connected to said second transistor to equalize said first and second operating voltages supplied respectively to said first and second memory cell arrays.

12. The device as claimed in claim 11, wherein each of said first and second memory cell arrays includes a set of sense amplifiers, the sets of sense amplifiers of said first memory cell arrays receiving said first operating voltage from said first transistor, and the sets of sense amplifiers of said second memory cell arrays receiving said second operating voltage from said second transistor.

13. The device as claimed in claim 12, wherein said second point, said first transistor, and said set of sense amplifiers of said first memory cell arrays are arranged in a first line in a second direction perpendicular to said first direction, said second point, said second transistor, and said set of sense amplifiers of said second memory cell array are arranged in a second line parallel with said first line in said second direction.

* * * * *